US011042805B2

(12) United States Patent
Sinitsyn et al.

(10) Patent No.: US 11,042,805 B2
(45) Date of Patent: Jun. 22, 2021

(54) POLLUTION ESTIMATION SYSTEM

(71) Applicant: SIGNIFY HOLDING B.V., Eindhoven (NL)

(72) Inventors: Alexandre Georgievich Sinitsyn, Veldhoven (NL); Ingrid Christina Maria Flinsenberg, Eindhoven (NL); Marc Aoun, Eindhoven (NL); Leszek Holenderski, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 1035 days.

(21) Appl. No.: 15/454,373

(22) Filed: Mar. 9, 2017

(65) Prior Publication Data
US 2017/0300818 A1   Oct. 19, 2017

(30) Foreign Application Priority Data
Mar. 10, 2016   (EP) .................................... 16159645

(51) Int. Cl.
*G06N 5/04* (2006.01)
*G06N 20/00* (2019.01)
(Continued)

(52) U.S. Cl.
CPC .............. *G06N 5/04* (2013.01); *G01M 15/10* (2013.01); *G06F 30/20* (2020.01); *G06N 3/08* (2013.01);
(Continued)

(58) Field of Classification Search
CPC ............ G06N 5/04; G06N 20/00; G06N 3/08; G06N 20/10; G06N 5/003; G06N 99/005;
(Continued)

(56) References Cited

U.S. PATENT DOCUMENTS 8,723,690 B2 * 5/2014 Kalyanaraman ..... G08G 1/0141
340/937
9,489,581 B2 * 11/2016 Chen .................. G06K 9/00476
(Continued)

FOREIGN PATENT DOCUMENTS

CN    104394636 A  *  3/2015
CN    205606498 U  *  9/2016
(Continued)

OTHER PUBLICATIONS

Alexandre et al., "Hybridizing Extreme Learning Machines and Genetic Algorithms to select acoustic feature in vehicle classification applications" Nov. 18, 2014, Neurocomputing, No. 152, pp. 58-68. (Year: 2014).*

(Continued)

*Primary Examiner* — Miranda M Huang
*Assistant Examiner* — Chase P. Hinckley

(57) ABSTRACT

A pollution estimation system (100) for estimating pollution level caused by exhaust gas of motor vehicles is provided. The system comprises an acoustic sensor interface (110) arranged to obtain use-data from an acoustic sensor comprising an audio sample of a motor vehicle sound and a trained exhaust gas model unit (120) arranged to receive as input the audio sample of the use-data and to apply a trained exhaust gas model to the received audio sample to produce an estimated pollution level associated with the received audio sample. The trained exhaust gas model has been obtained by training an exhaust gas model on multiple training items using a machine learning algorithm, the multiple training items comprising multiple audio samples of motor vehicle sounds obtained from one or more acoustic sensors and associated pollution levels.

17 Claims, 7 Drawing Sheets

(51) Int. Cl.
*G10L 25/48* (2013.01)
*G06N 3/08* (2006.01)
*G01M 15/10* (2006.01)
*G06F 30/20* (2020.01)
*G06Q 50/30* (2012.01)
*G06N 5/00* (2006.01)
*G06N 20/10* (2019.01)

(52) U.S. Cl.
CPC .............. *G06N 20/00* (2019.01); *G10L 25/48* (2013.01); *G06N 5/003* (2013.01); *G06N 20/10* (2019.01); *G06Q 50/30* (2013.01)

(58) Field of Classification Search
CPC ....... G01M 15/10; G10L 25/48; G06Q 50/30; G06F 17/5009; G06F 30/20
USPC .......................................................... 706/12
See application file for complete search history.

(56) References Cited

U.S. PATENT DOCUMENTS

| | | | | |
|---|---|---|---|---|
| 2006/0173579 | A1* | 8/2006 | Desrochers | G01N 1/26 700/276 |
| 2009/0115635 | A1* | 5/2009 | Berger | G01H 3/08 340/943 |
| 2011/0313958 | A1* | 12/2011 | Roverso | G01W 1/00 706/12 |
| 2012/0310703 | A1* | 12/2012 | Cavalcanti | H05B 45/10 705/7.29 |
| 2013/0110400 | A1* | 5/2013 | Moshe | G01N 1/26 702/3 |
| 2013/0144527 | A1* | 6/2013 | Kuhnreich | G01N 33/00 702/2 |
| 2013/0151063 | A1* | 6/2013 | Baughman | G06N 20/00 701/29.1 |
| 2013/0268242 | A1* | 10/2013 | Ferre | G01N 33/0075 702/188 |
| 2014/0139116 | A1* | 5/2014 | Reed | H05B 45/10 315/153 |
| 2014/0222510 | A1 | 8/2014 | Martin et al. | |
| 2015/0039269 | A1* | 2/2015 | Mejegard | G06Q 10/06 702/182 |
| 2015/0052975 | A1* | 2/2015 | Martin | G01N 33/00 73/31.02 |
| 2015/0110276 | A1* | 4/2015 | Gereb | G01H 3/125 381/56 |
| 2015/0156851 | A1 | 6/2015 | Ramer et al. | |
| 2015/0248834 | A1* | 9/2015 | Banerjee | G08G 1/0104 340/943 |
| 2015/0339586 | A1* | 11/2015 | Adjaoute | G06N 20/00 706/52 |
| 2015/0342007 | A1* | 11/2015 | Anderson | H05B 47/22 315/153 |
| 2016/0042234 | A1* | 2/2016 | Chen | G08G 1/0141 382/190 |
| 2016/0072891 | A1* | 3/2016 | Joshi | G06Q 30/0631 370/254 |
| 2016/0125307 | A1* | 5/2016 | Zheng | G06N 20/00 706/12 |
| 2016/0161456 | A1* | 6/2016 | Risk | G01N 33/0009 702/24 |
| 2016/0286627 | A1* | 9/2016 | Chen | H05B 47/105 |
| 2016/0286629 | A1* | 9/2016 | Chen | F21V 5/045 |
| 2016/0343180 | A1* | 11/2016 | Talwar | G01M 17/007 |
| 2016/0370339 | A1* | 12/2016 | Liu | G01N 33/0075 |
| 2017/0076509 | A1* | 3/2017 | Scofield | A61B 5/02055 |
| 2017/0248494 | A1* | 8/2017 | Miller | G01N 15/02 |
| 2018/0115751 | A1* | 4/2018 | Noone | H05B 47/115 |

FOREIGN PATENT DOCUMENTS

| | | | |
|---|---|---|---|
| EP | 0488150 | A2 | 6/1992 |
| KR | 100377680 | B1 * | 3/2003 |
| WO | 2012159633 | A1 | 11/2012 |
| WO | WO-2014020213 | A1 * | 2/2014 ........... G08G 1/0129 |
| WO | 2015159101 | A1 | 10/2015 |

OTHER PUBLICATIONS

Weber et al., "Assessing modelled outdoor traffic-induced noise and air pollution around urban structures using the concept of landscape metrics" Mar. 12, 2014, Landscape and Urban Planning, No. 125, pp. 105-116. (Year: 2014).*

Kumar et al., "Vehicular traffic noise modeling using artificial neural network approach" 2014, Transportation Research Part C 40, pp. 111-122. (Year: 2014).*

De Coensel et al., "Effects of traffic signal coordination on noise and air pollutant emissions" Feb. 9, 2012, Environmental Modelling and Software, pp. 1-12. (Year: 2012).*

Kubera et al., "Audio-Based Hierarchic Vehicle Classification for Intelligent Transportation Systems" 2015, pp. 343-352. (Year: 2015).*

Liu, Hang "Improving On-Road Emission Estimates with Traffic Detection Technologies" 2013, Doctoral Dissertation, University of California at Irvine, p. i-166. (Year: 2013).*

Arhami et al., "Predicting hourly air pollutant levels using artificial neural networks coupled with uncertainty analysis by Monte Carlo simulations" Jan. 6, 2013. (Year: 2013).*

Bhandarkaretal., "Vehicular Mechanical Condition Determination and On Road Traffic Density Estimation using Audio signals" 2014, IEEE Sixth International Conference on Computational Intelligence and Communication Networks, pp. 395-401. (Year: 2014).*

Morris et al., "Real-Time Video-Based Traffic Measurement and Visualization System for Energy/Emissions" Dec. 2012, IEEE Transactions on Intelligent Transportation Systems, vol. 13, No. 4, pp. 1667-1678. (Year: 2012).*

Iannone et al., "Speed Distribution Influence in Road Traffic Noise Prediction" Mar. 2013, Environmental Engineering and Management Journal , vol. 12, No. 3, pp. 493-501. (Year: 2013).*

Ji et al., "Signal coordination scheme based on traffic emission" 2016, IET Intelligent Transport Systems, pp. 89-96. (Year: 2016).*

Xiao et al., "An Intelligent Traffic Light Control Approach for Reducing Vehicles CO2 Emissions in VANET" 2015, IEEE 12th International Conference on Fuzzy Systems and Knowledge Discovery, pp. 2070-2075. (Year: 2015).*

Scora et al., "Real-Time Roadway Emissions Estimation using Visual Traffic Measurements" 2011, IEEE Forum on Integrated and Sustainable Transportation Systems, pp. 40-47. (Year: 2011).*

Tyagi et al., "Vehicular Traffic Density State Emission Based on Cumulative Road Acoustics" Apr. 12, 2012, IEEE Transactions on Intelligent Transportation Systems, vol. 13, No. 3, pp. 1156-1166. (Year: 2012).*

Zheng et al., "Urban Computing: Concepts, Methodologies, and Applications" Sep. 2014, ACM Transactions on Intelligent Systems, and Technology, vol. 5, No. 3, Art 38, pp. 1-55. (Year: 2014).*

Qiu et al., "Investigating the impact of urban grade-separation on pedestrian PM2.5 exposure" Feb. 1, 2015, pp. 1917-1927. (Year: 2015).*

Dhaou et al., "An Electronic System to Combat Drifting and Traffic Noise on Saudi Roads" Jun. 3-7, 2012, IEEE, pp. 217-222. (Year: 2012).*

Yu et al., "Sensor Deployment for Air Pollution Monitoring Using Public Transportation System" Feb. 1, 2015. (Year: 2015).*

Hasenfratz, David "Enabling Large-Scale Urban Air Quality Monitoring with Mobile Sensor Nodes" 2015, Doctoral Dissertation, Swiss Federal Institute of Technology Zurich, pp. i-170. (Year: 2015).*

Brienza et al., "A Low-Cost Sensing System for Cooperative Air Quality Monitoring in Urban Areas" 2015, Sensors, No. 15, pp. 12242-12259. (Year: 2015).*

Kramer et al., "A matheuristic approach for the Pollution-Routing Problem" Apr. 18, 2014, pp. 1-26. (Year: 2014).*

Meng et al., "A land use regression model for estimating the NO2 concentration in shanghai, China" Jan. 16, 2015, Environmental Research, No. 37, pp. 308-315. (Year: 2015).*

(56) References Cited

OTHER PUBLICATIONS

Villanueva et al., "Architecture for smart highway real time monitoring" 2013, IEEE, pp. 1277-1282. (Year: 2013).*

Shang et al., "Inferring Gas Consumption and Pollution Emissions of Vehicles throughout a City" Aug. 24-27, 2014. (Year: 2014).*

Vallejo et al., "Intelligent Surveillance for Understanding Events in Urban Traffic Environments" Aug. 2014, Intenational Journal of Distributed Sensor Networks, pp. 1-11. (Year: 2014).*

Jin et al., "An Information Framework for Creating a Smart City Through Internet of Things" Apr. 2014, IEEE Internet of Things Journal, vol. 1, No. 2, pp. 112-121 (Year: 2014).*

Olivera et al., "Reducing Vehicle Emissions and Fuel Consumption in the City by Using Particle Swarm Optimization" Jul. 2, 2012, Elsevier, pp. 1-12. (Year: 2012).*

Zou et al., "Remote Sensing Detection of the Spatial Pattern of Urban Air Pollution in Los Angeles" 2014, IEEE. (Year: 2014).*

Yu et al., "RAQ—A Random Forest Approach for Predicting Air Quality in Urban Sensing Systems" Jan. 11, 2016, pp. 1-18. (Year: 2016).*

Gomez-Lorente et al., "A new methodology for calculating roadway lighting design based on a multi-objective evolutionary algorithm" 2013, pp. 2156-2164. (Year: 2013).*

Evans et al., "Design Criteria for Adaptive Roadway Lighting" Jul. 2014, US Dept. of Transportation, Federal Highway Administration, pp. i-62. (Year: 2014).*

Dong, Fangxu, "Dynamic Adaptive Sampling for Environmental and Smart Lighting Distributed Sensor Applications" Sep. 2012, Thesis, Rennselaer Polytechnic Institute, pp. i-115. (Year: 2012).*

Morelli et al., "Short-term associations between traffic-related noise, particle number and traffic flow in three European cities" Dec. 5, 2014, pp. 25-33. (Year: 2014).*

Wu et al., "Effects of Urban Landscape Pattern on PM2.5 pollution—A Beijing Case Study" Nov. 13, 2015, pp. 1-20. (Year: 2015).*

Sorensen et al., "Combined effects of road traffic noise and ambient air pollution in relation to risk for stroke?" Jun. 4, 2014, pp. 49-55. (Year: 2014).*

Hyari et al., "Multiobjective Optimization of Roadway Lighting Projects" Mar. 17, 2016, pp. 1-10. (Year: 2016).*

Johnson et al., "Embedded System Design of an Advanced Illumination Measurement System for Highways" 2014. (Year: 2014).*

Gamo, et al., "Diesel Engine Exhaust Emissions Modelling Using Artificial Neural Networks," SAE Technical Paper Series, Reprinted From: Electronic Engine Controls 1999: Neural Networks, Diagnostic and Electronic Hardware, and Controls (SP-1419), 1999-01-1163, 1999 (8 Pages).

\* cited by examiner

POLLUTION ESTIMATION SYSTEM

CROSS-REFERENCE TO PRIOR APPLICATIONS

This application claims the benefit of European Patent Application No. 16159645.7, filed on Mar. 10, 2016, which is hereby incorporated by reference herein.

FIELD OF THE INVENTION

The invention relates to a pollution estimation system, a pollution estimation method, a computer program, and a computer readable medium.

BACKGROUND

Motor vehicle emissions contribute to air pollution and are a major ingredient in the creation of smog in cities. It is estimated that 15,000 hospital admissions are caused annually by diesel exhaust pollution in the United States (See "An Analysis of Diesel Air Pollution and Public Health in America. (v. 1.3)", Revised June 2005, by the CATF, page 8). There is therefore a desire to monitor pollution caused by vehicle exhausts, especially in cities. Through the monitoring insight may be obtained where pollution through vehicle exhaust is a particular problem. This information may then be used, say, for planning purposes, e.g., when planning new infrastructure in the city, or to regulate traffic, etc.

Pollution to which vehicle exhaust gas contributes includes the following: carcinogens, mono-nitrogen oxides (NOx) including nitric oxide (NO) and nitrogen dioxide (NO2), hydrocarbons (HC), carbon monoxide (CO), carbon dioxide (CO2), fine particles in particular diesel particulate.

Monitoring of vehicle exhaust gas is challenging as it requires sensing close to the source. Ideally, the sensing would be near the exhaust pipe of vehicles itself. Although this is possible to do for test cars, it is not suitable for large scale monitoring. Moreover, the potentially large number of different pollutant makes sensors also relatively expensive, if more than one type of pollution needs monitoring.

SUMMARY OF THE INVENTION

It would be advantageous to have an improved method of monitoring pollution caused by motor vehicle exhaust.

A pollution estimation system for estimating pollution level caused by exhaust gas of motor vehicles is provided. The system comprises
   an acoustic sensor interface arranged to obtain use-data from an acoustic sensor comprising an audio sample of a motor vehicle sound,
   a trained exhaust gas model unit arranged to receive as input the audio sample of the use-data and to apply a trained exhaust gas model to the received audio sample to produce an estimated pollution level associated with the received audio sample, wherein
   the trained exhaust gas model has been obtained by training an exhaust gas model on multiple training items using a machine learning algorithm, the multiple training items comprising multiple audio samples of motor vehicle sounds obtained from one or more acoustic sensors and associated pollution levels.

By taking an audio fragment of the sound of a motor vehicle, say a car, the trained exhaust gas model unit can estimate the pollution caused by that motor vehicle. In this way, the pollution estimation system does not require a pollution sensor to estimate pollution levels. In fact acoustic sensors may be used for multiple purposes and also function to estimate pollution levels.

The exhaust gas model may be, e.g., a neural network. The estimation system may be improved by a hybrid model comprising both a classifying model as well as a regression model. For example, in an embodiment, the exhaust gas model comprises a classification model and at least one regression model. A list of tags is defined for the exhaust gas model, each one of the regression models being associated with a tag of the list of tags. The classification model is arranged to predict a tag from an audio sample of a motor vehicle sound, and
   the trained exhaust gas model unit is arranged to
      apply the trained classification model to the audio sample of the use-data to obtain a predicted tag from the list of tags,
      apply the trained regression model associated with the predicted tag to the audio sample of the use-data to produce an estimated pollution level,
   the multiple training items comprising multiple audio samples of motor vehicle sounds, associated pollution levels, one or more associated tags, the tags being selected from the list of tags.
The exhaust gas model may have been obtained by
   training the classification model on the multiple audio samples of motor vehicle sounds and the associated tags of the multiple training items, thus obtaining a trained classification model arranged to predict a tag from an audio sample of a motor vehicle sound, and
   training each particular regression model of the at least one regression model on the audio samples of the multiple audio samples associated with the tag associated with the particular regression model, thus obtaining at least one regression model arranged to estimate a pollution level from an audio sample of a motor vehicle sound of a particular tag.

In an embodiment, at least two tags of the list of tags indicate a fuel type of motor vehicle, said two tags distinguishing at least between motor vehicles using gasoline and diesel fuel. It was found that a classifier can distinguish between the sounds of a car on diesel and one running on gasoline. A regression model specialized for diesel or gasoline then translates the sound to an estimate.

In an embodiment, the system comprises an outdoor luminaire, e.g., an outdoor lighting pole, wherein the outdoor luminaire comprises an acoustic sensor arranged to obtain an audio sample of a motor vehicle sound as use-data. For example, the system may comprise multiple acoustic sensors distributed in an area, e.g., in lighting poles.

In an embodiment, the pollution estimation system is connected to a traffic management system, the pollution estimation system sending a warning message, if pollution levels exceed a threshold, to the traffic management system causing the traffic management system to adjust traffic flow.

The pollution estimation system is an electronic system. The exhaust model unit is an electronic device and may be implemented on a computer.

The pollution estimation method described herein may be applied in a wide range of practical applications. Such practical applications include localizing regions where pollution levels are high, controlling traffic, and the like.

A method according to the invention may be implemented on a computer as a computer implemented method, or in dedicated hardware, or in a combination of both. Executable code for a method according to the invention may be stored on a computer program product. Examples of computer program products include memory devices, optical storage devices, integrated circuits, servers, online software, etc. Preferably, the computer program product comprises non-transitory program code stored on a computer readable medium for performing a method according to the invention when said program product is executed on a computer.

In a preferred embodiment, the computer program comprises computer program code adapted to perform all the steps of a method according to the invention when the computer program is run on a computer. Preferably, the computer program is embodied on a computer readable medium.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. In the Figures, elements which correspond to elements already described may have the same reference numerals. In the drawings, FIG. 1a schematically shows an example of an embodiment of a pollution estimation system, FIGS. 1b-1f schematically show examples of embodiments of an exhaust gas model unit, FIG. 1g schematically shows an example of an embodiment of a pollution training system, FIGS. 2a-2d schematically show examples of embodiments of sensor units FIG. 3 schematically shows an example of an embodiment of a lighting system, FIG. 4 schematically shows an example of an embodiment of a pollution estimation method, FIG. 5a schematically shows a computer readable medium having a writable part comprising a computer program according to an embodiment, FIG. 5b schematically shows a representation of a processor system according to an embodiment, FIG. 6 schematically shows in a graph an example of noise of an auto and CO2 emission related to speed.

LIST OF REFERENCE NUMERALS IN FIGS. 1a-3

Figure 1A:
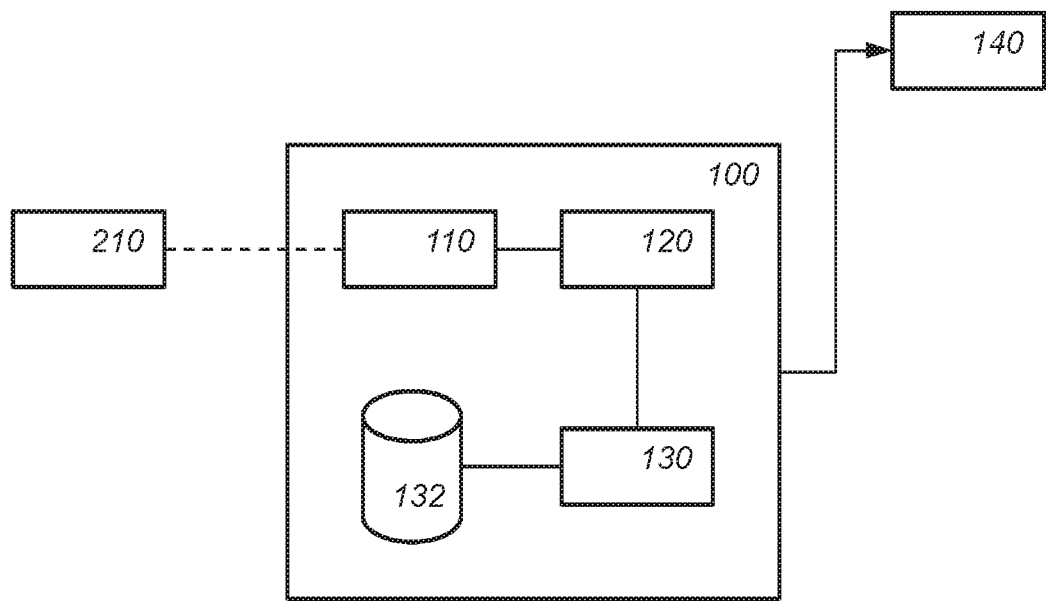

100 a pollution estimation system
101 a pollution training system
110 an acoustic sensor interface
120 an exhaust gas model unit
121 a classification model
122 a selector
123.1-123.3 a tag prediction
124 multiple regression models
124.1-124.3 a regression model
125 integrated multiple regression models
126 a feature extractor
126.1-126.4 extracted features
130 a machine learning unit
132 training database
140 a traffic management system
201-204 a sensor unit
210 an acoustic sensor
220 a camera
230 a processor
240 a pollution sensor
300 a lighting system
310 a road
330-335 a lighting pole
340 light fixture
341 a construction element
342 a pole

DETAILED DESCRIPTION OF PREFERRED EMBODIMENTS

While this invention is susceptible of embodiment in many different forms, there are shown in the drawings and will herein be described in detail one or more specific embodiments, with the understanding that the present disclosure is to be considered as exemplary of the principles of the invention and not intended to limit the invention to the specific embodiments shown and described.

In the following, for the sake of understanding, elements of embodiments are described in operation. However, it will be apparent that the respective elements are arranged to perform the functions being described as performed by them.

Further, the invention is not limited to the embodiments, and the invention lies in each and every novel feature or combination of features described above or recited in mutually different dependent claims.

There is a need to obtain insight in the pollution in an area, say in a city, which does not require equipping each car with a pollution sensor. In fact, it is also preferred if pollution sensors where not or only limitedly needed at all. Embodiments described below use acoustic sensors, say mounted in light poles, to record vehicle sounds. From the sounds of the vehicles the pollution is then estimated. This provides a low cost way to provide quick insight in the pollution in an area. Especially relative pollution, e.g., how much worse pollution is in one area compared to another area can be quickly obtained in this manner. Compared with distributing a large number of pollution sensors the costs are also relatively low. Furthermore, in an embodiment, quite different types of pollutions, say mono-nitrogen oxides and diesel particulate, may be estimated from a single sensor, in this case an acoustic sensor. In the context of this document, pollution refers to pollution caused by exhausts fumes of motor vehicles.

Interestingly, motors producing high exhaust gas also produce loud noise at that moment. An embodiment is proposed in which a connected lighting infrastructure is equipped with acoustic sensors that capture sound of motors exhausting gas. As the location of each light point is known, the location and tracking of vehicles producing high volume of exhaust gas can be done. Acoustic sensor may also be installed in different locations than light poles.

Figure 6:
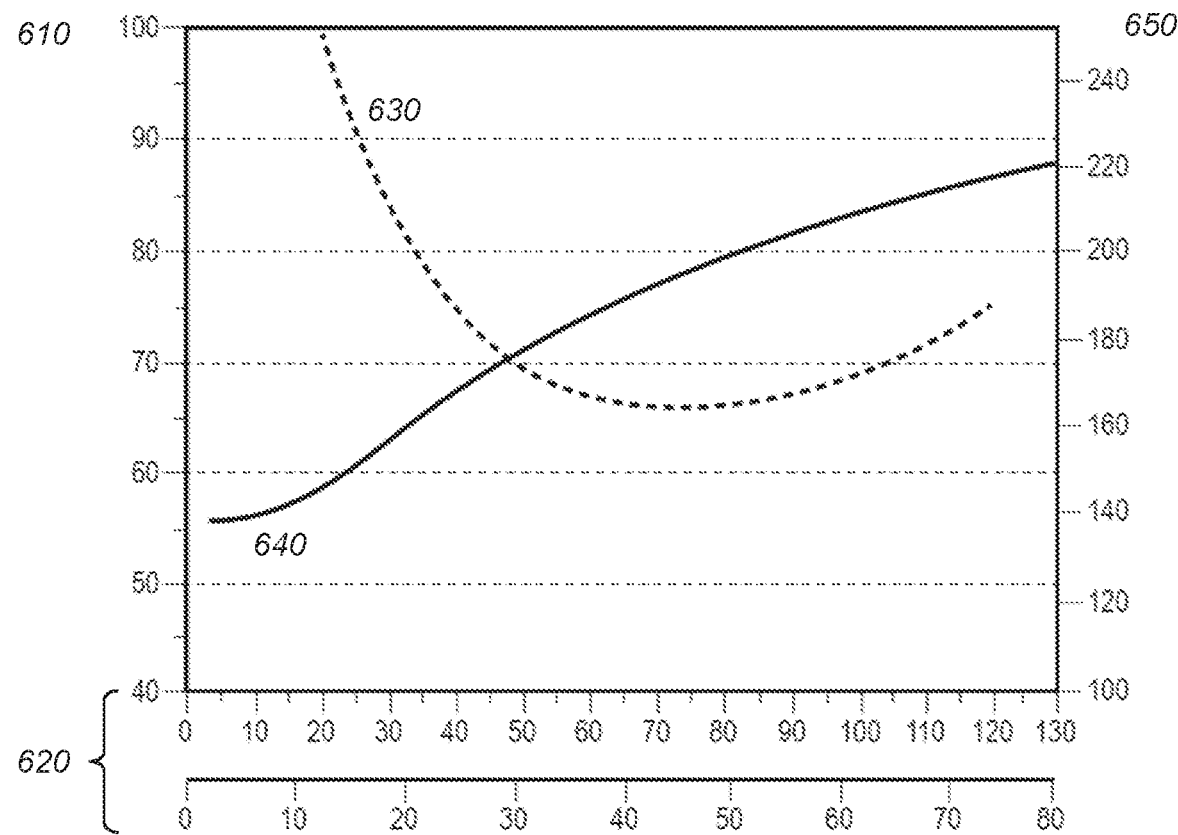

FIG. 6 schematically shows in a graph 600 an example of noise of an auto and CO2 emission related to speed.

Shown in graph 600 is a horizontal axis 620. Horizontal axis 620 shows the vehicle speed of an auto. The upper axis shows the speed in kilometers per hour, the bottom axis shows the speed in miles per hour. A vertical left axis 610 shows the A-weighted sound-level in dBA.

The sound-level is obtained as a single vehicle passes by a microphone 15 meters (50 feet) to the side, its sound level rises, reaches a maximum, and then falls as the vehicle recedes down the roadway. The maximum A-weighted sound level during the pass by is called that vehicle's noise-emission level. We refer to the "Federal Highway Administration's Traffic Noise Model (FHWA TNM®), Version 1.0—Technical Manual" of the US Department of Transportation for the exact computation of A-weighted noise levels. Solid line 640 shows a relationship between the speed and noise-emission level of an auto vehicle. Note that the noise level increases with the speed.

FIG. 6 also shows a vertical right axis 650. Vertical right axis 650 shows the direct emission (also referred to as the tailpipe emission) of CO2 in g/km. Broken line 630 shows a relationship between the speed and direct CO2 emission of a car (running on gasoline). As can be seen from FIG. 6, the CO2 emission decreases with the speed until it reaches a minimum at an optimal speed, and then increases again. This pattern of emission decrease until an optimal speed after which emissions rise again is seen for other fuel types as well, e.g., diesel, or LPG. The optimal speed and the exact nature of decreasing and increasing will however vary.

FIG. 6 shows that there is also a relationship between noise-level and CO2 emission. From the sound of the car an estimate of CO2 emission can be made. This relationship differs however for different motor vehicles.

FIG. 1a schematically shows an example of an embodiment of a pollution estimation system 100. Pollution estimation system 100 is configured to estimate a pollution level caused by exhaust gas of motor vehicles. For example, pollution estimation system 100 may be configured to estimate levels of mono-nitrogen oxides. Pollution estimation system 100 may be configured to estimate multiple different types of pollutants separately. Pollution estimation system 100 may also be configured to estimate a combined pollution level, e.g., a weighted sum of multiple types of pollutants. Pollution estimation system 100 may express the pollution in any suitable unit, say gram per second. Examples of motor vehicles include vehicles arranged for driving on a road, e.g., cars, motorcycles, busses, etc.

Pollution estimation system 100 comprises an acoustic sensor interface 110 arranged to obtain use-data from an acoustic sensor 210. The use data comprises an audio sample of a motor vehicle sound. An audio sample may also be referred to as an audio fragment. For example, pollution estimation system 100 may be implemented in a computer, e.g., a server. The audio interface 110 may be a computer network connection, e.g., an internet connection. For example, a connection may be established between acoustic sensor 210 over a 3G connection and/or a wired a connection, etc. Acoustic sensor 210 may be a microphone. Acoustic sensor 210 and pollution estimation system 100 may be two separate systems located at different places. However, different distributions are also possible. For example, pollution estimation system 100 and one or more acoustic sensors may together form a system.

Pollution estimation system 100 may be integrated in a single device, e.g., a computer. Pollution estimation system 100 may also be implemented in a distributed fashion. For example, pre-processing, e.g., feature extraction (see below) may be performed at acoustic sensor 210 while the rest of the pollution estimation takes place at a further device implementing the rest of pollution estimation system 100. For example, a pollution estimation device may comprise acoustic interface 110 and trained model unit 120.

For example, interface 110 may be internal to an estimation device receiving audio samples from an acoustic sensor. For example, interface 110 may be internal to a sensor unit receiving audio samples from an acoustic sensor. In the latter case the sensor unit may perform part or all of the processing of the exhaust gas model.

Acoustic sensor 210 may be arranged to record sound continuously, e.g., longer than the duration of an audio sample. From the longer recording, the audio sample may be selected. Alternatively, acoustic sensor 210 may be arranged to record an audio sample occasionally; e.g., at regular intervals; e.g. at the request of pollution estimation system 100, etc. An audio sample, may be a few seconds long, say 5 seconds, or 10 seconds, etc. A longer audio sample may be an hour long, a day, or non-stop, etc.

Pollution estimation system 100 comprises a trained exhaust gas model unit 120 arranged to receive as input the audio sample of the use-data and to apply trained exhaust gas model 120 to the received audio sample to produce an estimated pollution level associated with the received audio sample.

For example, the exhaust gas model may comprise a large number of parameters, e.g., stored in an electronic storage, say in a memory, and an algorithm that applies said parameters to the inputs. The algorithm may be predetermined, say determined by the type of machine learning and system designer. The parameters may be selected by a machine learning algorithm.

Trained exhaust gas model 120 has been previously obtained by training an exhaust gas model on multiple training items using a machine learning algorithm. In this way, an estimation of pollution, or of a pollution increase, may be obtained from audio data, i.e., the audio data obtained from acoustic sensor 210, even if no pollution sensor is available.

It is noted that the audio sensors may also be used for other purposes. For example, acoustic sensor 210 and/or further acoustic sensors used by system 100 may be used for gunshot detection. A distributed array of acoustic sensors may detect the gunshot blast at slightly different times, which may be used to calculate the location of the origin of the discharge. In an embodiment, the acoustic sensors are arranged with a clock to specify when the audio was recorded.

Pollution estimation system 100 may optionally comprise a machine learning unit 130. Machine learning unit 130 has access to a training database 132. Training database 132 may be located in pollution estimation system 100, e.g., at the same location as exhaust gas model unit 120. For example, training database 132 may be stored in a server, in the cloud etc.

Training database 132 stores multiple training items. The multiple training items comprise multiple audio samples of motor vehicle sounds obtained from one or more acoustic sensors and associated pollution levels.

To construct the multiple training items multiple motor sounds of multiple motor vehicles in use have been obtained from one or more acoustic sensors, e.g., sensors like acoustic sensor 210. The multiple motor sounds, e.g., audio samples, are associated with pollution levels of the multiple motor vehicles in use. In addition to an audio sample, and a pollution level, a training item may also comprise one or more tags. The tags give information on the type of motor, type of use etc. Tags provide additional training data to the model. Other relevant information may be recorded in database 132 as well, e.g., time of day, date, measurement location, etc. Some of the other relevant information may be used as additional inputs; for example, information on environmental conditions, such as, e.g., temperature, wind speed, and humidity.

The tags in the training items may be selected from a list of tags. In an embodiment, at least two tags of the list of tags indicate a fuel type of the motor vehicle, said two tags distinguishing at least between motor vehicles using gasoline and diesel fuel. A further tag may be electric or LPG, e.g. gas. For example, the list of tags indicating a fuel type of the motor vehicle may be {diesel, gasoline}, {diesel, gasoline, electric}, or, {diesel, gasoline, electric, gas}, etc.

In an embodiment, at least two tags of the list of tags indicate a current use of a motor vehicle, said two tags distinguishing at least between motor vehicles running stationary and running non-stationary. A further use may be increasing speed, decreasing speed, running at constant speed, etc. For example, the list of tags indicating a use type may be {running-stationary, running-non stationary}, or, {running-stationary, constant speed, increasing speed, decreasing speed}, etc.

The use of tags is optional. In an embodiment, only tags of certain types may be used, e.g., only tags that indicate fuel type or motor type. The tags may be added to training items on an availability basis. On the other hand, in an embodiment, each training item has assigned to it all appropriate tags. A list of tags may have the tag 'unknown'.

For example, in an embodiment, database 132 may comprise a table, containing pairs of an audio-sample reference, e.g., a pointer, a filename etc, and a pollution level, and one or more tags. For example, a table may look like this:

| Audio Sample | Tags | Pollutant |
| --- | --- | --- |
| Audioref_ptr_31534 | gasoline, non-stationary | 128.8 g/km $CO_2$ |
| Audioref_ptr_65434 | diesel, non-stationary | 129.2 g/km $CO_2$ |
| Audioref_ptr_99873 | electric, stationary | 0 g/km $CO_2$ |

The "Audioref_ptr" refer to an audio sample. The values refer to a pollution level in a suitable unit and using a suitable measurement method. The tags may refer to information to the type of motor or use, etc. In this case tags are assigned from the two lists {gasoline, diesel, electric} and {non-stationary, stationary}. Two lists of tags may be combined in a single tag list. For example, a tag may be used that indicates both fuel type and use type. For example, the list of tags may be {non-stationary+gasoline, non-stationary+diesel, non-stationary+electric, stationary+gasoline, stationary+diesel, stationary+electric}. The above values are examples, for specific cars, and a specific pollutant. In an embodiment, values are provided for different or multiple pollutants.

Machine learning unit 130 is arranged to train an exhaust gas model on the multiple training items using a machine learning algorithm, thus obtaining a trained exhaust gas model.

There are several machine learning algorithms that may be used including classifying and regression algorithms. Suitable classifiers include neural networks, support vector machines, decision tree and random forests. Regression may be regression tree, polynomial regression. Conventional machine learning algorithms may be used for machine learning unit 130. Below advantageous hybrid architectures will be discussed that is also capable of using tags. Such tags may significantly reduce the required number of training items and/or increase the accuracy of the system for a given amount of training data.

Figure 1C:
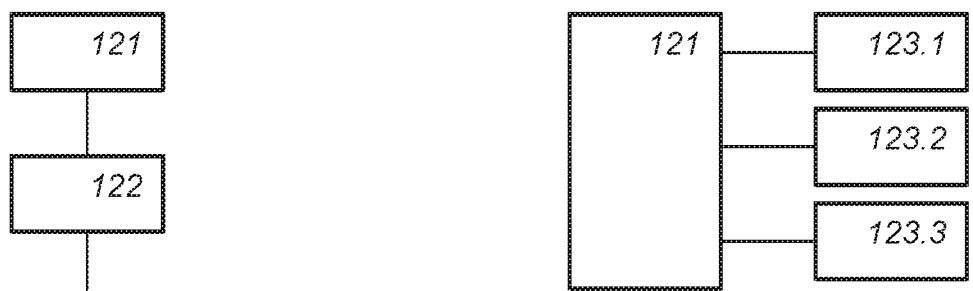

Once exhaust gas model unit 120 is trained, machine learning unit 130 is not needed anymore. So database 132 and machine learning unit 130 are optional in pollution estimation system 100. On the other hand, to train the exhaust gas model no acoustic sensor interface 110 is needed, if a database 132 is available. An embodiment of a machine learning system comprises exhaust gas model 120, database 132 and machine training unit 130. FIG. 1g schematically shows a pollution training system 101 comprising database 132, machine learning unit 130 and exhaust gas model 120. Once exhaust gas model 120 is trained it may be placed in pollution estimation system 100, e.g., without training unit 130 and/or database 132.

Training data may be obtained in several ways. For example, audio samples of common car types may be obtained, e.g., measured using an acoustic sensor. For example one may put a motor vehicle, say a car, on a roller bank and obtain the audio sample. The audio sample may be a few seconds, e.g., 5 seconds. An audio sample may be longer than a training sample. Together with obtaining the audio sample, also exhaust pollution information may be obtained, e.g., by measuring it. The audio recording and pollution sensing may be run continuous. While the car is run through a sequence of different operations, different pollution values are measured. In this way, a large audio sample, say of an hour long, and a corresponding record of the pollution is obtained. Later the large audio sample may be cut up into audio samples say of 5, 6, seconds etc. For example, a moving window of a pre-determined audio sample size may be used. The sequence may be standardized and used for multiple vehicles. The location and type of pollution sensor may also be standardized. For example, the pollution sensor may be located at the exhaust pipe of the car. This will lead to a pollution estimation system that estimates pollution at the exhaust pipe, even though the acoustic sensor is located further away.

If tags are used, the audio sample and pollution pairs may also be associated to one or more tags. For example, a training item may be associated with a type of car, e.g., bus/car, and a use type, increase gas, stationary, etc. For example, the training data may be represented as a table with in a first column audio samples, a second column a pollution level, and a third column a car classification.

Training data may be also obtained by placing the pollution sensor further away from the exhaust pipe. Training data may even be obtained by sound recording at a road used for motor vehicles. A human may spot and record tags, say auto types. A sensor may measure pollution at the roadside. As the pollution sensor is not directly located near the exhaust pipe in this embodiment, a reduced accuracy must be accepted. A time delay may be introduced between measuring the audio sample and the measuring of the pollution. For example, if the time delay is 1 minute, an audio sample measured at time t=0 will be associated with pollution levels measured at t=1 minute. In any embodiment, it is possible to measure an increase in pollution levels rather than an absolute pollution level; in this embodiment this possibility is especially useful, as there may be background pollution. Furthermore, in this embodiment, the training items may be provided with additional factors that impact distribution of the pollution level between the motor vehicle and the sensor, say humidity. The humidity may be provided to the exhaust model as an additional input, both during training and use.

In an embodiment, road side training data is used and audio samples are much longer than 5 seconds, say 1 hour or more. The 1 hour audio sample may be aggressively reduced in size and/or feature extraction may be done at the sensor. For example, the audio sample may be divided into, e.g., 20 second long periods, of which energy is computed. In combination the model may predict pollution increase of a road size sensor rather than absolute pollution values.

The model may also be trained on samples having sound of multiple vehicles in them. Such combined samples may be obtained at a roadside location. Combined samples may also be produced from a roller bank. For example, given multiple training items of a single car, the audio may be mixed to obtain sample corresponding to multiple cars. The model may instead be trained only on audio samples of single cars; during use the model may be applied to single cars passing the sensor.

In an embodiment, the multiple training items are obtained by continuously measuring audio during a training interval from an acoustic sensor at a roadside location. For example, the training interval may be longer than one audio sample; for example the training interval may be at least 500 times longer than the duration of a single audio sample; for example, the training interval may be an hour or a day using audio samples of 5 seconds. The embodiment further comprises continuously measuring pollution levels during the training interval from a pollution sensor at the roadside location. From the recorded pollution levels and the recorded sound, multiple audio samples of motor vehicle sounds may be selected together with a corresponding selection from the pollution level; the latter may include a delay to compensate for the time the pollution takes to travel from the vehicle exhaust to the sensor.

Figure 2A:
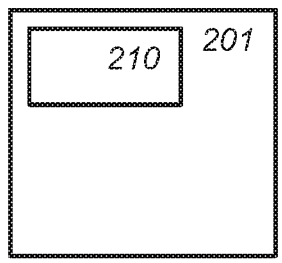

The training items may be used with a monolithic model, say one neural network or support vector machine that takes as input an audio sample, and/or features computed from the audio samples (see below) and produces as output a pollution level estimate. Training data of this kind is especially suited for use with a monolithic model, say a large neural network, say, employing deep learning. Such a system may also use tags, e.g., as an additional input to the model, but it is not necessary. An advantage of, say, a deep neural network is that relatively little investment in features and model architecture is required. Below embodiments are described with combine different types of trainable models, and which are capable of using tags advantageously. FIG. 2d (further described below) shows a sensor unit which may be used to capture this training data.

Figure 1B:
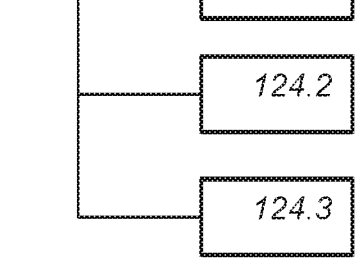

FIG. 1b schematically discloses an embodiment of an exhaust gas model 120. This exhaust gas model comprises a classification model 121 and multiple regression models. Shown in FIG. 1b are regression models 124.1, 124.2, and 124.3. There may be more or fewer regression models. A list of tags is defined for the exhaust gas model. Examples include the fuel-type or use-type tags introduced above. For simplicity we will assume the fuel type tags, in the description of this embodiment, but the same embodiment may be used for use-type tags, for the combined type tags, or even multiple lists of tags. For example, we may use the tag list {diesel, gasoline, electric}.

Each tag is associated with a regression model of the multiple regression models. For example, diesel may be associated with regression model 124.1; gasoline with 124.2 and electric with 124.3. In an embodiment, a plurality of tags from the list of tags are associated with the same regression model. This option allows the model to be extended later with more detailed regressions models. For example, this is useful as more training data becomes available.

Classification model 121 is arranged to predict a tag from an audio sample of a motor vehicle sound. Exhaust gas model unit 120 is arranged to apply the trained classification model to the audio sample of the use-data to obtain a predicted tag from the list of tags. For example, classification model 121 is provided with the audio sample of a motor vehicle sound from the use-data and predicts a tag, or one or more tags, associated with the audio sample. For example, if classification model 121 were presented with audio sample 'Audioref_ptr_31534' of the previous example, then classification model 121 would be expected to produce the tag gasoline.

The classification model may produce a probability measure for each of the tags in the list of tags. For example, classification model 121 may produce as output that tag gasoline has a probability of 78%, diesel of 15%, and electric of 7%. FIG. 1c shows a classification model 121 producing a number of tag predictions equal to the number of tags in the list of tags. FIG. 1c shows tag predictions 123.1, 123.2 and 123.3. For example, these tag predictions may correspond to the tags diesel, gasoline and electric. If only one tag is assigned from the list of tags to an audio sample, for example as might be the case for a list of fuel types, the output of the classification model 121 may be a probability distribution, e.g., summing to 1. However, if multiple tags may be used, e.g., to also include use types, the output of classification model 121 may also indicate multiple tags.

For example, classification model 121 may be a neural network. The neural network may have an input layer comprising multiple input-nodes. At least part of the input-node may receive audio values from the audio sample possibly after preprocessing, e.g., Fourier analysis, frequency reduction, etc. We refer to "Audio chord recognition with recurrent neural networks", by Boulanger-Lewandowski, et al. for appropriate neural network architecture. Note that the although the cited paper is completely unrelated to pollution estimation or to motor vehicles in general, the neural networks for processing audio may be used for exhaust gas model 120, and in particular for classifier 121.

Exhaust gas model unit 120 is arranged to apply the trained regression model associated with the predicted tag to the audio sample of the use-data to produce an estimated pollution level. For example, in the above example, exhaust gas model unit 120 might take gasoline as the predicted tag, e.g., because it has the highest probability and apply the corresponding regression model 124.2.

For example, exhaust gas model unit 120 may comprise a selector 122 arranged to receive the output of classification model 121, and determine a suitable regression model therefrom. For example, selector 122 may be arranged to determine a predicted tag from said output and select and apply the regression model that is associated with the predicted tag.

In an embodiment, each of the regression models is applied and the resulting predictions are averaged using as weights the probability of each tag. For example, said weighting may be performed by selector 122.

This model is a hybrid model containing both a classification model and a regression model. To train the hybrid model, multiple training items may be used comprising multiple audio samples of motor vehicle sounds, associated pollution levels, and one or more associated tags, the tags being selected from the list of tags.

The classification model is trained by training unit 130 on the multiple audio samples of motor vehicle sounds and the associated tags of the multiple training items, thus obtaining a trained classification model arranged to predict a tag from an audio sample of a motor vehicle sound. Each one of the regression models is trained by training unit 130 on the audio samples of the multiple audio samples associated with the tag associated with the particular regression model, thus obtaining multiple trained regression models arranged to estimate a pollution level from an audio sample of a motor vehicle sound of a particular tag.

It is an insight of the inventors that different types of vehicles have a different type of relationship between sound and pollution. By isolating the classification part of the problem, this part can be optimized separately. For example, the classifier may be chosen to be a neural network or support vector machine, etc. The regression models may be regression tree, polynomial regression, etc.

In an embodiment, the classification model 121 is a neural network and one or more regression models are polynomials regression models.

Figure 1D:
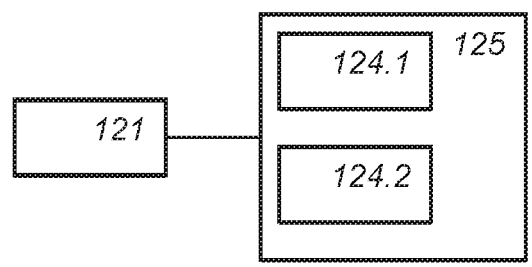
Figure 1E:
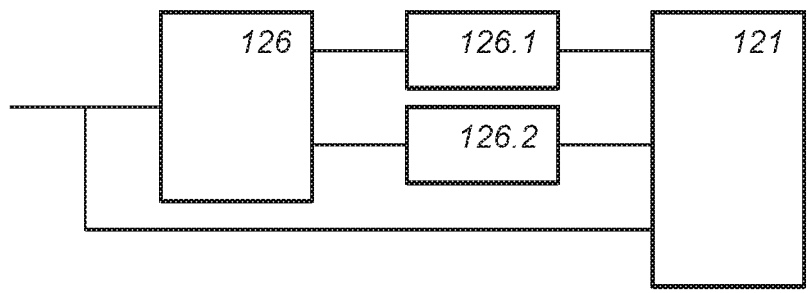

If desired the multiple regression models may be combined in a single model. One such embodiment is shown in FIG. 1d. In the field of regression, it is possible to define a model by including one or more terms that have a limited number of possible values. This can be used to insert the tag value into a single model. The rest of the model terms that do not depend on this tag value are the same for all tags. Thus the regression models are combined into a single model which has tag dependent variables.

In an embodiment, the exhaust gas model unit comprises a feature extractor 126. Feature extractor 126 computes values from an audio sample that are expected to be correlated with the desired outcome of the exhaust gas model unit. For example, in FIG. 1e, feature extractor 126 computes two features 126.1 and 126.2 that are given as inputs to the classification model 121. The audio samples themselves may also be given as inputs to the classification model 121.

For example, features may be obtained from the audio sample,
  Amplitude
  Frequency domain
  Sound variation
  Trend analysis, how does the sound change, e.g. increase or decrease
  noise level, e.g., maximum noise level, e.g., A-weighted noise level.

A feature may be a single number, say the total amount of energy, but may also be multiple numbers, e.g., the frequency analysis of the sample.

Figure 1F:
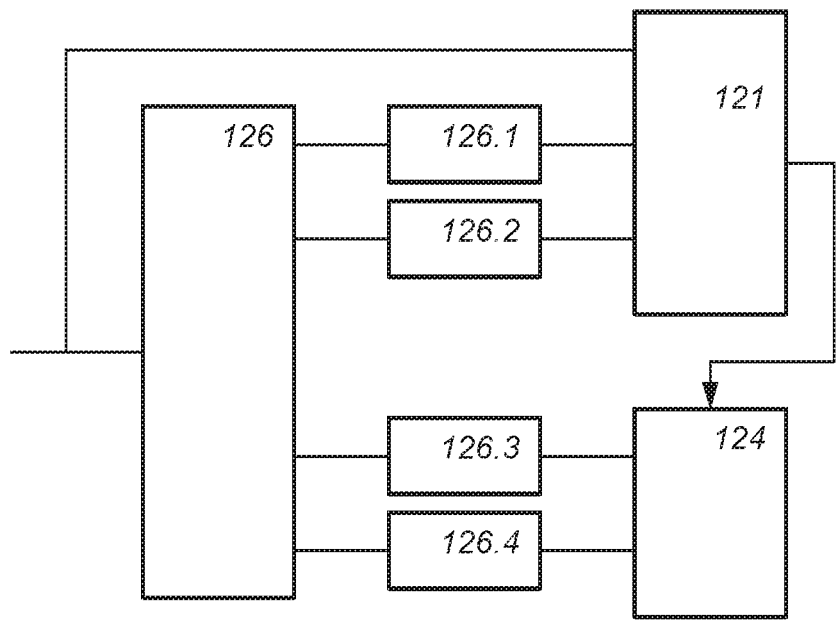
Figure 1G:
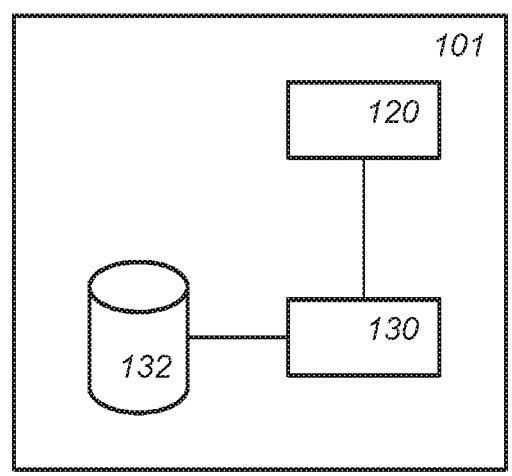

FIG. 1f shows an embodiment in which the feature extractor extracts different features for the classification model and the regression models. Features 126.1 and 126.2 are used for the classification model and features 126.3 and 126.4 are used for the regression models. In the embodiment shown the regression models do not receive as inputs the full audio samples, only features, whereas the classification model does receive the full audio sample.

It was found that pollution levels and sound volume correspond reasonably well, but that exact nature of the correspondence depends on the type of motor vehicle. The embodiment shown in FIG. 1f is adapted to this observation. The regression models 124 may use a relatively simple correspondence, e.g., by receiving as input volume, or energy in a certain band etc., but the correct regression model is selected by a, probably, larger classification model. The latter does not need to predict the level of pollution but only say the type (tag) of motor vehicle.

In an embodiment, the exhaust model is restricted to recognizing only vehicles that are known to produce large amounts of pollution gas. For example, a tag 'ignore' could be introduced, such a tag could be coupled to an empty regression model that simply outputs a default value, say an average pollution level, or the corresponding audio sample could be ignored altogether.

In an embodiment, a single regression model is used. For example, the list of tags may comprise two tags: an ignore-tag and a tag that identifies a high polluting type of vehicle. For example, the list of tags may be {diesel, ignore}. The ignore tag is applied to all non-diesel vehicles, and the diesel tag is associated with sounds of diesel vehicles. Only if the classification model predicts the diesel tag, is the regression model used. The latter is trained to estimate pollution for diesel vehicles. If the ignore tag is predicted, the model may generate a corresponding signal, or may produce a default average pollution value, etc.

In an embodiment pollution estimation system 100 is distributed over multiple locations, for example feature extractor 126 is located at the acoustic sensor but classification and regression models 121 and 124 are located in a server. In one embodiment, the classification model also does not receive the full audio samples, only extracted features. The latter option can be efficiently combined with the distributed embodiment, as it saves bandwidth.

In embodiments, the acoustic sensor may be implemented in a sensor unit. Several types of sensor units are shown in FIGS. 2a-2d, each one thereof may be used with the different embodiment of pollution estimation system 100. For example, FIG. 2a shows a sensor unit 201 comprising an acoustic sensor 210 arranged to obtain an audio sample of a motor vehicle sound as use-data. Pollution estimation system 100 may communicate with the sensor unit, e.g., through interface 110. Pollution estimation system 100 may also comprise the sensor unit.

Figure 2B:
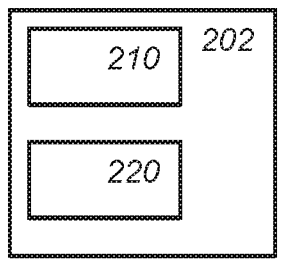

FIG. 2b shows a sensor unit 202 which additionally comprises a camera 220 arranged to capture an image of the motor vehicle, e.g. of its license plates, if the estimated associated pollution level is above a pollution threshold. Using this sensor unit vehicles that produce a lot of pollution can be tracked down, so that the driver of the said vehicle may receive, e.g., a friendly warning.

Figure 2C:
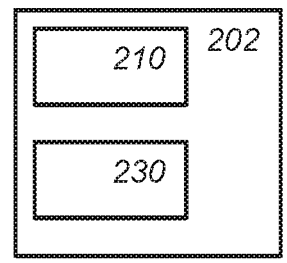
Figure 2D:
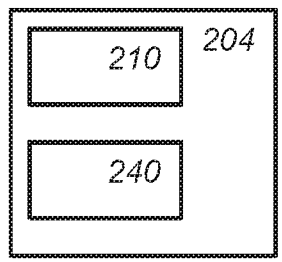

FIG. 2c shows a sensor unit 203 comprising acoustic sensor 210, and a processor 230. Sensor unit 203 may also contain memory for storing software for execution at processor 230. Processor 230 may be used to perform processing at the sensor unit. For example, processor 230 may be configured as an audio compression unit arranged to reduce the size of the audio sample of a motor vehicle sound before transmitting the audio sample from an acoustic sensor to the trained exhaust gas model unit. The reducing may use a type of compression. The compression may be loss-less, e.g., fully reversible at the receiving end, or lossy. For example, the compression may include any one of discretizing, clustering, etc. These may be used to reduce the amount of data to be transmitted. If a lossy compression is used then preferably also audio data used for training went through the same compress and reverse cycle as the use-data.

For example, processor 230 may be arranged as a feature extractor, like feature extractor 126. If only extracted features are transmitted, a significant reduction in bandwidth may be obtained.

Each one of the sensors units may be combined with a transmission unit (not separately shown in FIGS. 2a-2d) arranged to transmit audio data to pollution estimation system 100, e.g., to audio interface 110. The transmission may stream the audio received at the acoustic sensor to the audio interface, e.g., over 3G or 4G, or over Wi-Fi, etc.

Figure 3:
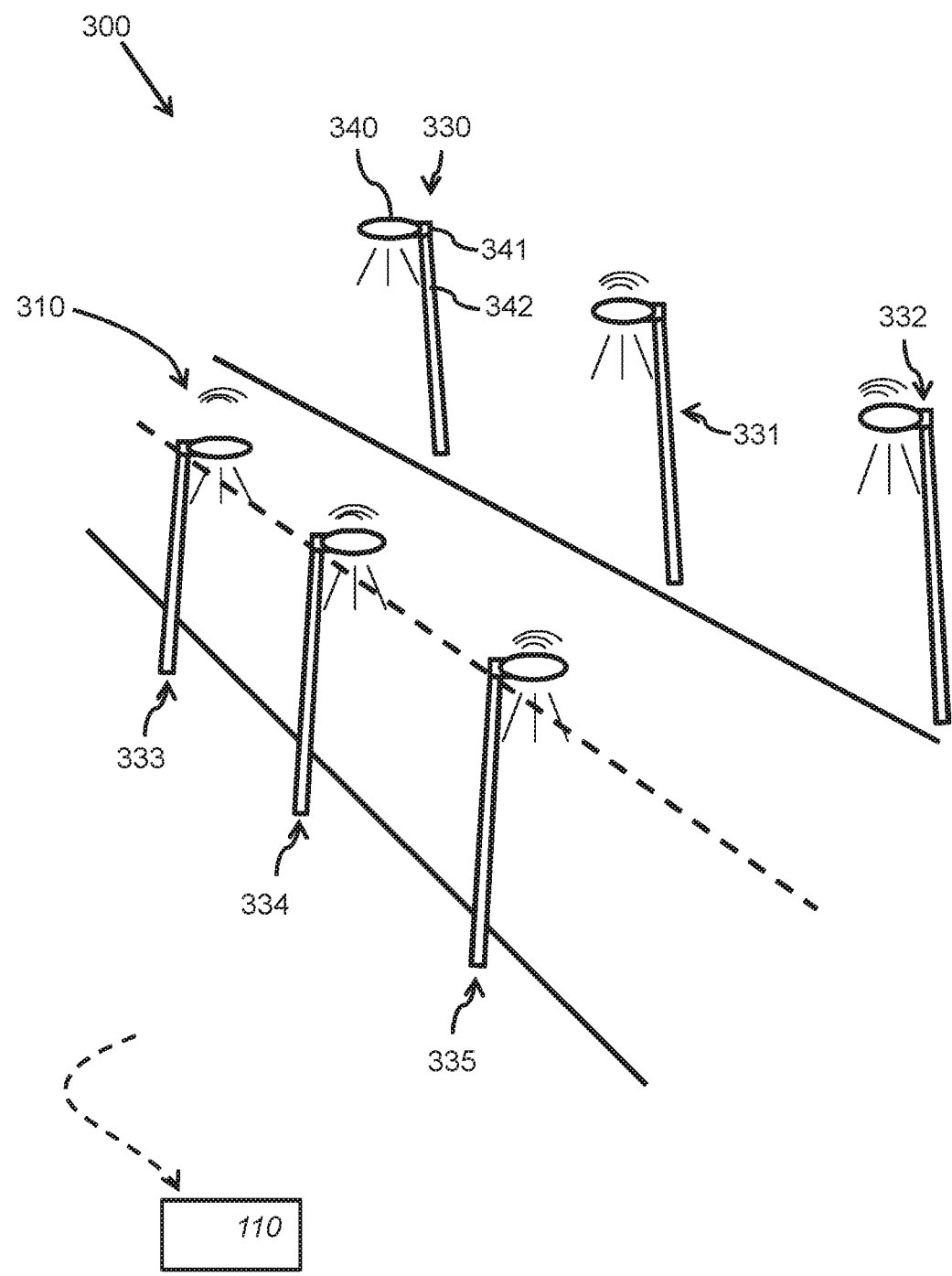

FIG. 3 schematically shows an embodiment comprising an outdoor luminaire, in this case outdoor lighting poles 330-335. The outdoor luminaires comprise an acoustic sensor arranged to obtain an audio sample of a motor vehicle sound as use-data. The outdoor luminaires may be configured to transmit the audio sample to audio interface 110.

In this document, the term lighting pole refers to the pole itself together with the light fixture at the top of the pole and additional optional driving circuitries provided in the pole and/or in the light fixture at the top of the pole. For lighting pole 330 distinct elements have been indicated, namely the light fixture 340, a pole 342 and a construction element 341 at the top of the pole which comprises, for example, a driving circuitry for driving the lamp in the light fixture 340.

In an example, the system 100 of FIG. 1 is provided in lighting pole 330. For example, the sensor 210 is provided in the light fixture 340 and is focused on the street below the lighting pole 330. As such, a portion of the street close to lighting pole 330 is an associated area for this sensor. Other elements of the system 100 are, for example, provided in the element 341 that also comprises the driving circuitry of the lamp. The pollution estimation algorithm may be embedded in each luminaire and/or run from a central computer, e.g. in the cloud, using data obtained from each luminaire.

In an example, each one of the lighting poles 331-335 are provided with an acoustic sensor and are provided with a transmitter, say a wireless transmitter. Each sensor in the lighting poles 331-335 has an associated surface that is a portion of the street that is close to and illuminated by the respective lighting poles 331-335. For example, lighting pole 335 may detect sound produced by a car or other motor vehicle passing underneath lighting pole 335. An audio sample of the sound of the car is obtained by the acoustic sensor and transmitted wirelessly to audio interface 110. Additional information may include current time and possibly other sensor measurement, e.g., humidity sensors, wind sensors etc.

In an embodiment, acoustic sensors in lighting pole along the roads in cities recognize sound of motors that emit high volumes of exhaust gas into the air and optionally locate such vehicles. For example, an identification of the lighting pole or of the acoustic sensor that made the recording may be transmitted together with the audio sample.

In an embodiment one could use the system to estimate overall pollution levels in an area (e.g. city). In an embodiment, the pollution estimation system is connected to a traffic management system 140. This option is illustrated in FIG. 1a. If the estimated pollution levels exceed a threshold the pollution estimation system may send a warning message, to the traffic management system causing the traffic management system to adjust traffic flow.

Knowing the areas with high air pollution and/or roads on which vehicles with high emission of exhaust gas are not allowed, the system can warn the authorities about location and time of such a rule violation. The authorities can also use the information to identify the source of most air pollution and use it to shape city policies.

Having the pollution estimates, various uses present themselves. For example
  Report on pollution.
  Divert traffic.
  Decrease/Increase speed. Depending on current average speed (if speed is too low, try to increase, if too high try to decrease)
  Make traffic smoother,
  Keep traffic lights longer on red For example to make traffic smoother one may place traffic signals on a coordinated system so that drivers encounter a progression of green lights (also known as a 'green wave'). Cutting speed can also significantly reduce emissions of other pollutants, particularly reducing NOx and particulate matter (PM) output from diesel vehicles.

In an embodiment, the model separately warns for motor vehicles that run stationary (also known as running idle). Idle detection is important as it represents an easy way to reduce emission. For example, when location are identified where cars often idle, warning signs may be presented to reduce the amount of time drivers idle their engines. Idle detection is possible having the classification model 121 predict a stationary and non-stationary tag. Idle detection may also be done standalone without prediction pollution levels. An example of such a system is an idle detection system for detecting motor vehicles running stationary. The system comprises
  an acoustic sensor interface 110 arranged to obtain use-data from an acoustic sensor comprising an audio sample of a motor vehicle sound,
  a trained model unit arranged to receive as input the audio sample of the use-data and to apply a trained model to the received audio sample to produce a prediction if the motor vehicle is running stationary,
  the trained model has been obtained by training a model on multiple training items using a machine learning algorithm, the multiple training items comprising multiple audio samples of motor vehicle sounds obtained from one or more acoustic sensors,
  the model comprises a classification model 121, a list of tags being defined for the model, the classification model being arranged to predict a tag from an audio sample of a motor vehicle sound, the list of tags including at least a tag for running stationary and for running non-stationary,
  the trained model unit is arranged to
    apply the trained classification model to the audio sample of the use-data to obtain a predicted tag from the list of tags,
  the multiple training items comprising multiple audio samples of motor vehicle sounds, and one or more associated tags, the tags being selected from the list of tags,
  the model having been obtained by
    training the classification model on the multiple audio samples of motor vehicle sounds and the associated tags of the multiple training items, thus obtaining a trained classification model arranged to predict a tag from an audio sample of a motor vehicle sound.

Typically, the device 100 and 201-204 each comprise a microprocessor (not separately shown) which executes appropriate software stored at the devices; for example, that software may have been downloaded and/or stored in a corresponding memory, e.g., a volatile memory such as RAM or a non-volatile memory such as Flash (not separately shown). Alternatively, the devices 100 and 201-204 may, in whole or in part, be implemented in programmable logic, e.g., as field-programmable gate array (FPGA). The devices may be implemented, in whole or in part, as a so-called application-specific integrated circuit (ASIC), i.e. an integrated circuit (IC) customized for their particular use. For example, the circuits may be implemented in CMOS, e.g., using a hardware description language such as Verilog, VHDL etc.

In an embodiment, pollution estimation system 100 comprises an acoustic sensor interface circuit, and an exhaust gas model circuit. The device 100 may comprise additional circuits, e.g., sensor circuit, audio compression circuit, a machine learning circuit. The circuits implement the corresponding units described herein. The circuits may be a processor circuit and storage circuit, the processor circuit executing instructions represented electronically in the storage circuits. The circuits may also be FPGA, ASIC or the like.

Figure 4:
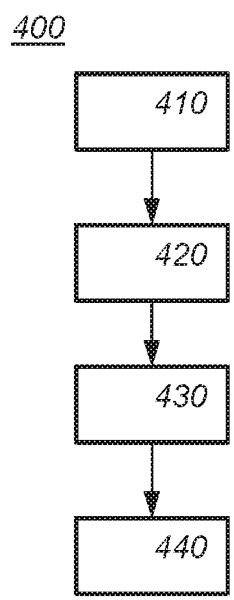

FIG. 4 schematically shows an embodiment of a pollution estimation method 400 for estimating a pollution level caused by exhaust gas of motor vehicles. Method 400 comprises obtaining (410), from one or more acoustic sensors, multiple motor sounds of multiple motor vehicles in use, and associated pollution levels of the multiple motor vehicles in use, thus obtaining the multiple training items comprising multiple audio samples of motor vehicle sounds and associated pollution levels, and training (420) an exhaust gas model on multiple training items using a machine learning algorithm, thus obtaining a trained exhaust gas model.

obtaining (430) use-data from an acoustic sensor comprising an audio sample of a motor vehicle sound, applying (440) a trained exhaust gas model to the received audio sample to produce an estimated associated pollution level, wherein the trained exhaust gas model has been obtained by training an exhaust gas model on multiple training items using a machine learning algorithm, the multiple training items comprising multiple audio samples of motor vehicle sounds obtained from one or more acoustic sensors and associated pollution levels.

Many different ways of executing the method are possible, as will be apparent to a person skilled in the art. For example, the order of the steps can be varied or some steps may be executed in parallel. Moreover, in between steps other method steps may be inserted. The inserted steps may represent refinements of the method such as described herein, or may be unrelated to the method. For example, steps 430 and 440 may be executed, at least partially, in parallel. Moreover, a given step may not have finished completely before a next step is started.

A method according to the invention may be executed using software, which comprises instructions for causing a processor system to perform method 400. Software may only include those steps taken by a particular sub-entity of the system. The software may be stored in a suitable storage medium, such as a hard disk, a floppy, a memory, an optical disc, etc. The software may be sent as a signal along a wire, or wireless, or using a data network, e.g., the Internet. The software may be made available for download and/or for remote usage on a server. A method according to the invention may be executed using a bitstream arranged to configure programmable logic, e.g., a field-programmable gate array (FPGA), to perform the method.

It will be appreciated that the invention also extends to computer programs, particularly computer programs on or in a carrier, adapted for putting the invention into practice. The program may be in the form of source code, object code, a code intermediate source and object code such as partially compiled form, or in any other form suitable for use in the implementation of the method according to the invention. An embodiment relating to a computer program product comprises computer executable instructions corresponding to each of the processing steps of at least one of the methods set forth. These instructions may be subdivided into subroutines and/or be stored in one or more files that may be linked statically or dynamically. Another embodiment relating to a computer program product comprises computer executable instructions corresponding to each of the means of at least one of the systems and/or products set forth.

Figure 5A:
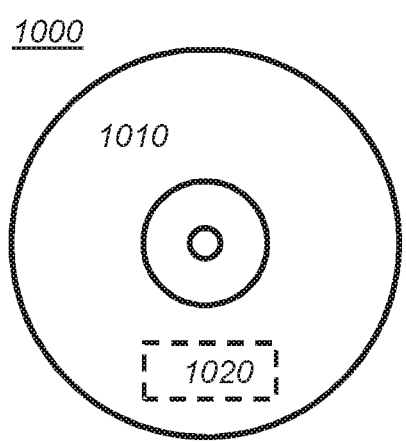

FIG. 5a shows a computer readable medium 1000 having a writable part 1010 comprising a computer program 1020, the computer program 1020 comprising instructions for causing a processor system to perform a pollution estimation method, according to an embodiment. The computer program 1020 may be embodied on the computer readable medium 1000 as physical marks or by means of magnetization of the computer readable medium 1000. However, any other suitable embodiment is conceivable as well. Furthermore, it will be appreciated that, although the computer readable medium 1000 is shown here as an optical disc, the computer readable medium 1000 may be any suitable computer readable medium, such as a hard disk, solid state memory, flash memory, etc., and may be non-recordable or recordable. The computer program 1020 comprises instructions for causing a processor system to perform said pollution estimation method.

Figure 5B:
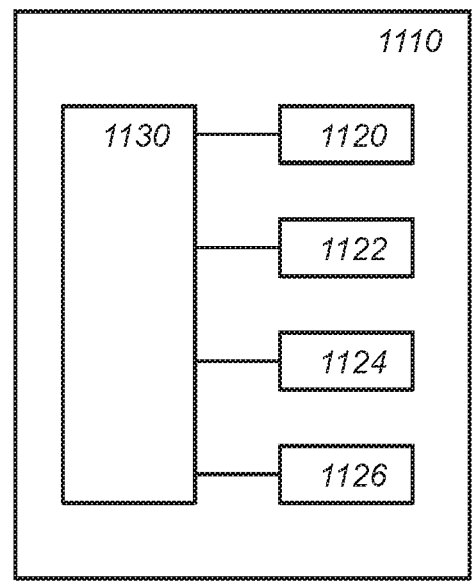

FIG. 5b shows in a schematic representation of a processor system 1140 according to an embodiment. The processor system comprises one or more integrated circuits 1110. The architecture of the one or more integrated circuits 1110 is schematically shown in FIG. 5b. Circuit 1110 comprises a processing unit 1120, e.g., a CPU, for running computer program components to execute a method according to an embodiment and/or implement its modules or units. Circuit 1110 comprises a memory 1122 for storing programming code, data, etc. Part of memory 1122 may be read-only. Circuit 1110 may comprise a communication element 1126, e.g., an antenna, connectors or both, and the like. Circuit 1110 may comprise a dedicated integrated circuit 1124 for performing part or all of the processing defined in the method. Processor 1120, memory 1122, dedicated IC 1124 and communication element 1126 may be connected to each other via an interconnect 1130, say a bus. The processor system 1110 may be arranged for contact and/or contact-less communication, using an antenna and/or connectors, respectively.

It should be noted that the above-mentioned embodiments illustrate rather than limit the invention, and that those skilled in the art will be able to design many alternative embodiments.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

In the claims references in parentheses refer to reference signs in drawings of embodiments or to formulas of embodiments, thus increasing the intelligibility of the claim. These references shall not be construed as limiting the claim.

The invention claimed is:

1. A pollution estimation system for estimating pollution level caused by exhaust gas of motor vehicles, the system comprising:
   an acoustic sensor interface arranged to obtain use-data from connected lighting devices having an acoustic sensor comprising an audio sample of a motor vehicle sound in an area, the connected lighting devices and/or the acoustic sensor comprising identifying information;
   a processor comprising a trained exhaust gas model circuit arranged to receive as input the audio sample of the use-data and to apply a trained exhaust gas model to the received audio sample to produce an estimated pollution level caused by exhaust gas of motor vehicles associated with the received audio sample, wherein the trained exhaust gas model comprises a plurality of parameters and an algorithm configured to apply the plurality of parameters to the audio sample input;

wherein the trained exhaust gas model has been obtained by training an exhaust gas model on multiple training items using a machine learning algorithm, the multiple training items comprising multiple audio samples of motor vehicle sounds obtained from one or more acoustic sensors and multiple measured pollution levels of motor vehicles obtained from one or more pollution sensors, wherein each measured pollution level is associated with each audio sample of the multiple audio samples such that each measured pollution level is paired with each audio sample of the respective multiple audio samples based on the acquired data; and wherein the processor is configured to output the estimated pollution level and/or the identifying information when the estimated pollution level is above a pollution threshold.

2. The pollution estimation system as in claim 1, wherein:

the exhaust gas model comprises a classification model and at least one regression model, a list of tags being defined for the exhaust gas model, each one of the regression models being associated with a tag of the list of tags, the classification model being arranged to predict a tag from the audio sample of the motor vehicle sound, and the trained exhaust gas model circuit is arranged to:
apply the trained classification model to the audio sample of the use-data to obtain a predicted tag from the list of tags,
apply a trained regression model of the at least one regression model associated with the predicted tag to the audio sample of the use-data to produce the estimated pollution level caused by exhaust gas, the multiple training items comprising multiple audio samples of motor vehicle sounds, associated pollution levels, one or more associated tags, the tags being selected from the list of tags, the exhaust gas model having been obtained by:
training the classification model on the multiple audio samples of motor vehicle sounds and the associated tags of the multiple training items, thus obtaining a trained classification model arranged to predict a tag from an audio sample of a motor vehicle sound, and
training each particular regression model of the at least one on the audio samples of the multiple audio samples associated with the tag associated with the particular regression model, thus obtaining at least one arranged to estimate a pollution level from an audio sample of a motor vehicle sound of a particular tag.

3. The pollution estimation system as in claim 2, wherein the exhaust gas model comprises multiple regression models, at least two tags of the list of tags being associated with different regression models of the multiple regression models.

4. The pollution estimation system as in claim 2, wherein:
at least two tags of the list of tags indicate a fuel type of motor vehicle, said two tags distinguishing at least between motor vehicles using gasoline and diesel fuel, and/or
at least two tags of the list of tags indicate a current use of a motor vehicle, said two tags distinguishing at least between motor vehicles running stationary and running non-stationary.

5. The pollution estimation system as in claim 1, wherein the exhaust gas model circuit is arranged to produce multiple estimated pollution levels of at least two different pollutants.

6. The pollution estimation system as in claim 1, further comprising:
a sensor circuit comprising:
the acoustic sensor arranged to obtain the audio sample of the motor vehicle sound as the use-data, and
a camera arranged to capture an image of the motor vehicle if the estimated associated pollution level is above the pollution threshold.

7. The pollution estimation system as in claim 1, comprising an outdoor luminaire, wherein the outdoor luminaire comprises the acoustic sensor arranged to obtain the audio sample of the motor vehicle sound as the use-data.

8. The pollution estimation system as in claim 1, comprising a compression circuit arranged to reduce the size of the audio sample of the motor vehicle sound before transmitting the audio sample from the acoustic sensor to the trained exhaust gas model unit.

9. The pollution estimation system as in claim 1, wherein the multiple training items are obtained by:
continuously measuring audio during a training interval from the acoustic sensor at a roadside location;
continuously measuring pollution levels during the training interval from the one or more pollution sensors located at the motor vehicle proximate the roadside location; and
obtaining multiple audio samples of motor vehicle sounds and associated pollution levels as parts of the continuously measured audio and corresponding parts of the continuously measured pollution levels.

10. The pollution estimation system as in claim 1, comprising:
a machine learning circuit arranged to obtain from one or more acoustic sensors multiple motor sounds of multiple motor vehicles in use, and associated pollution levels of the multiple motor vehicles in use, thus obtaining multiple training items comprising multiple audio samples of motor vehicle sounds obtained from one or more acoustic sensors and associated pollution levels, and
train an exhaust gas model on the multiple training items using a machine learning algorithm, thus obtaining a trained exhaust gas model.

11. The pollution estimation system as in claim 1, wherein the exhaust gas model circuit is arranged to compute one or more features from the received audio sample, and to apply the trained exhaust gas model to the computed features.

12. A pollution estimation method for estimating a pollution level caused by exhaust gas of motor vehicles, the method comprising:
obtaining use-data from connected lighting devices having an acoustic sensor comprising an audio sample of a motor vehicle sound in an area, wherein the acoustic sensor and/or the connected lighting devices comprise identifying information;
applying a trained exhaust gas model to the received audio sample to produce an estimated associated pollution level caused by exhaust gas of motor vehicles, wherein the trained exhaust gas model comprises a plurality of parameters and an algorithm configured to apply the plurality of parameters to the audio sample input;
wherein the trained exhaust gas model has been obtained by training an exhaust gas model on multiple training items using a machine learning algorithm, the multiple training items comprising multiple audio samples of motor vehicle sounds obtained from one or more acoustic sensors and multiple measured pollution levels of motor vehicles obtained from one or more pollution sensors, wherein each measured pollution level is associated with each audio sample of the multiple audio samples such that each measured pollution level is paired with each audio sample of the respective multiple audio samples based on the acquired data; and outputting the estimated associated pollution level and/or the identifying information when the estimated associated pollution level is above a pollution threshold.

13. The pollution estimation method as in claim 12, the method comprising:

obtaining, from one or more acoustic sensors, multiple motor sounds of multiple motor vehicles in use, and associated pollution levels of the multiple motor vehicles in use, thus obtaining the multiple training items comprising multiple audio samples of motor vehicle sounds and associated pollution levels, and training the exhaust gas model on the multiple training items using the machine learning algorithm, thus obtaining the trained exhaust gas model.

14. Computer program for estimating a pollution level from exhaust gas of motor vehicles arranged to cause a processor to perform the method as claimed in claim 12.

15. A computer program as in claim 14 embodied on a computer readable medium.

16. A roadside pollution estimation device configured to generate a pollution level estimate caused by exhaust gas of a motor vehicle, the device comprising:

an acoustic sensor configured to record an audio sample of a motor vehicle sound;

a processor configured to receive the obtained audio sample, and further configured to apply a trained exhaust gas model to the received audio sample to generate a pollution level estimate caused by exhaust gas for the obtained audio sample, wherein the exhaust gas model comprises a classification model and a regression model associated with each tag of a list of tags defined for the exhaust gas model, the classification model being arranged to predict a tag of the list of tags from the audio sample of the motor vehicle sound, and each regression model being arranged to generate the pollution level estimate based on the tag predicted by the classification model; and a communication element configured to communicate the generated pollution level estimate;

wherein the trained exhaust gas model is generated via a machine learning algorithm trained on multiple training items, the multiple training items comprising multiple audio samples of motor vehicle sounds obtained from one or more acoustic sensors and multiple measured pollution levels of motor vehicles obtained from one or more pollution sensors, wherein each measured pollution level is associated with each audio sample of the multiple audio samples such that each measured pollution level is paired with each audio sample of the respective multiple audio samples based on the acquired data.

17. The roadside pollution estimation device as in claim 16, wherein:

at least two tags of the list of tags indicate a current use of a motor vehicle, said two tags distinguishing at least between motor vehicles increasing speed and decreasing speed.

* * * * *